United States Patent [19]

Park

[11] Patent Number: 5,599,729
[45] Date of Patent: Feb. 4, 1997

[54] STATIC RANDOM ACCESS MEMORY CELL AND METHOD OF FABRICATING THE SAME

[75] Inventor: Joon-Young Park, Seoul, Rep. of Korea

[73] Assignee: LG Semicon Co., Ltd., Rep. of Korea

[21] Appl. No.: 528,320

[22] Filed: Sep. 14, 1995

[51] Int. Cl.⁶ .................................................. H01L 21/70
[52] U.S. Cl. .............................. 437/52; 437/41; 437/59; 437/48
[58] Field of Search .......................... 437/52, 41 RMM, 437/40 TFT, 41 TFT, 59, 48, 915; 148/DIG. 126

[56] References Cited

U.S. PATENT DOCUMENTS

| | | | |
|---|---|---|---|
| 5,179,033 | 1/1993 | Adan | 437/41 RMM |
| 5,348,903 | 9/1994 | Pfiester et al. | 437/52 |
| 5,516,715 | 5/1996 | Itabashi et al. | 437/52 |

OTHER PUBLICATIONS

International Electron Devices Meeting 1990, San Francisco, CA Dec. 9–12, 1990, Sponsored by Electron Devices Society of IEEE, pp. 18.1.1–18.1.4.
International Electron Devices Meeting 1992, San Francisco, CA Dec. 13–16, 1992, Sponsored by Electron Devices Society of IEEE, pp. 32.7.1–32.7.4.

*Primary Examiner*—Trung Dang

[57] ABSTRACT

An SRAM cell and a method of fabricating the SRAM cell are disclosed. The method includes the steps of forming a plurality of active regions and field regions on a substrate, forming a first common gate electrode and two impurity-doped regions to form two first bulk transistors, forming a second common gate electrode and two impurity-doped regions to form two second bulk transistors, forming a gate oxide layer on the substrate, forming a conductive layer, and etching back the conductive layer to thereby form two thin film transistors.

8 Claims, 8 Drawing Sheets

STATIC RANDOM ACCESS MEMORY CELL AND METHOD OF FABRICATING THE SAME

BACKGROUND OF THE INVENTION

The present invention relates to a semiconductor memory device and a method of fabricating the same, and more particularly, to a static random access memory (hereinafter referred to as SRAM) cell and method of fabricating the same.

Generally, an SRAM cell consists of either four transistors (for example, two for accessing and two for driving) and two polysilicon load resistors, or six transistors. A high density memory cell of over 4Mb is made in the form of CMOS transistors, consisting of four NMOS transistors and two PMOS transistors.

FIG. 1 is an equivalent circuit of a conventional CMOS-type SRAM. Referring to this drawing, four NMOS transistors Q1–Q4 are formed on a semiconductor substrate. Two PMOS transistors Q5 and Q6 are formed thereon as thin film transistors (TFTs).

A method of fabricating the conventional SRAM of FIG. 1 will be discussed below with reference to FIGS. 2A–5.

FIG. 2a is a layout of bulk transistors of an SRAM cell in accordance with the conventional art.

FIG. 2b is a layout of TFTs of the SRAM cell in accordance with the conventional art.

FIG. 3 is a layout of an SRAM cell constructed in such a manner that the TFTs of FIG. 2b are formed on the bulk transistors of FIG. 2a.

FIG. 4 is a cross-sectional view of the SRAM cell shown in FIG. 3, taken along the line IV—IV of FIG. 3.

FIG. 5 is a cross-sectional view of the SRAM cell of FIG. 3, taken along the line V—V of FIG. 3.

Referring to FIGS. 2a–5, according to the method of fabricating the conventional SRAM cell, active regions 32 and field regions 32a are defined on a semiconductor substrate 31.

A first gate oxide 33 is formed on the active regions 32. Polysilicon and cap gate nitride 34 are sequentially deposited on the first gate oxide 33. They are patterned and etched through photolithography to define a first gate electrode 35. A sidewall oxide 37 is formed on both sides of the first gate electrode 35.

Subsequently, first and second impurity-doped regions 39 and 41 are formed by ion-implanting polysilicon into the active regions 32. A first interlevel insulating layer 43 is then deposited on the overall surface of the substrate, and selectively etched to expose a predetermined portion thereof. Polysilicon is deposited on the first interlevel insulating layer 43 and contacts the first impurity-doped region 39, to form a Vss line 44.

A second interlevel insulating layer 45 and polysilicon are deposited on the Vss line 44 having a contact 44a. The obtained polysilicon layer is patterned through photolithography, to form a second gate electrode 46 having a contact 46a. A second gate oxide 47 and polysilicon are deposited on the overall surface of the substrate. Using an offset mask 48, impurities are doped into the second gate oxide 47 to form a body 49 of a TFT. The formed TFT comprises source, drain and channel regions. Then, to improve the characteristics of the transistor, heat treatment is carried out. As a result, the grain size of the polysilicon in the body 49 is enlarged. The conventional SRAM cell further includes an insulating layer 50 and a bitline 51 having a contact 51a.

After performing exposure and etch processes, a metallization process is performed to finish forming the SRAM cell. However, the SRAM cell formed by the conventional method involves several problems.

First, when the TFT is formed on the bulk transistor, the process of forming the second gate electrode is carried out independent of that of the first gate electrode. This increases the number of processing steps necessary in forming a TFT.

Second, accurate offset alignment is difficult to achieve because the position of the offset mask of the TFTs varies with the arrangement of the bulk transistor. This deteriorates the characteristics of the TFTs.

Third, the second gate electrode and body of the TFTs are formed on the bulk transistor, resulting in poor step coverage. As a result, it becomes difficult to perform the metallization process.

SUMMARY OF THE INVENTION

It is an object of the present invention to provide an SRAM cell and method of fabricating the same, in which a common gate electrode is used both for a bulk transistor and for a TFT, reducing the number of processing steps involved.

Another object of the present invention is to provide an SRAM cell and method of fabricating the same, in which offset alignment is accurately performed to improve characteristics of the TFT.

Yet another object of the present invention is to provide an SRAM cell and method of fabricating the same, which enhances step coverage and simplifies the metallization process.

To accomplish the above objects of the present invention, there is provided a static random access memory cell, comprising: a semiconductor substrate; a plurality of active regions defined on the substrate; two first bulk transistors having a common gate electrode and two impurity-doped regions, the gate electrode and impurity-doped regions being formed on the active regions; two second bulk transistors spaced from the two first bulk transistors, the bulk transistors including another common gate electrode and two impurity-doped regions, the gate electrode and impurity-doped regions being formed on the active regions; and two thin film transistors formed on the two second bulk transistors, the thin film transistors using the common gate-electrode as their gate electrode, the thin film transistors including a conductive layer formed on the common gate electrode, to thereby form bodies of the respective thin film transistors.

For the objects of the present invention, there is further provided a method of fabricating an SRAM cell, comprising the steps of: preparing a semiconductor substrate; forming a plurality of active regions and field regions on the substrate; forming a common gate electrode and two impurity-doped regions on the active regions to thereby form two first bulk transistors, and simultaneously forming a common gate electrode and two impurity-doped regions on the active regions separated from the first bulk transistors by a predetermined distance to thereby form two second bulk transistors; forming a gate oxide layer on the overall surface of the substrate; forming a conductive layer to form a thin film transistor body on the gate oxide layer; and etching back the conductive layer so that the conductive layer remains only on a common gate electrode of the respective first and second bulk transistors, Vss connectors overlapping the common gate electrodes by a predetermined width, and transistor connectors overlapping with a common gate electrode of the second bulk transistor by a predetermined width, thereby forming two thin film transistors.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 3 is a layout of an SRAM cell constructed in such a manner that the TFTs of FIG. 2b are formed on the bulk transistors of FIG. 2a;

DETAILED DESCRIPTION OF THE PREFERRED EMBODIMENTS

A preferred embodiment of the present invention will be explained below with reference to the accompanying drawings.

Figure 1:
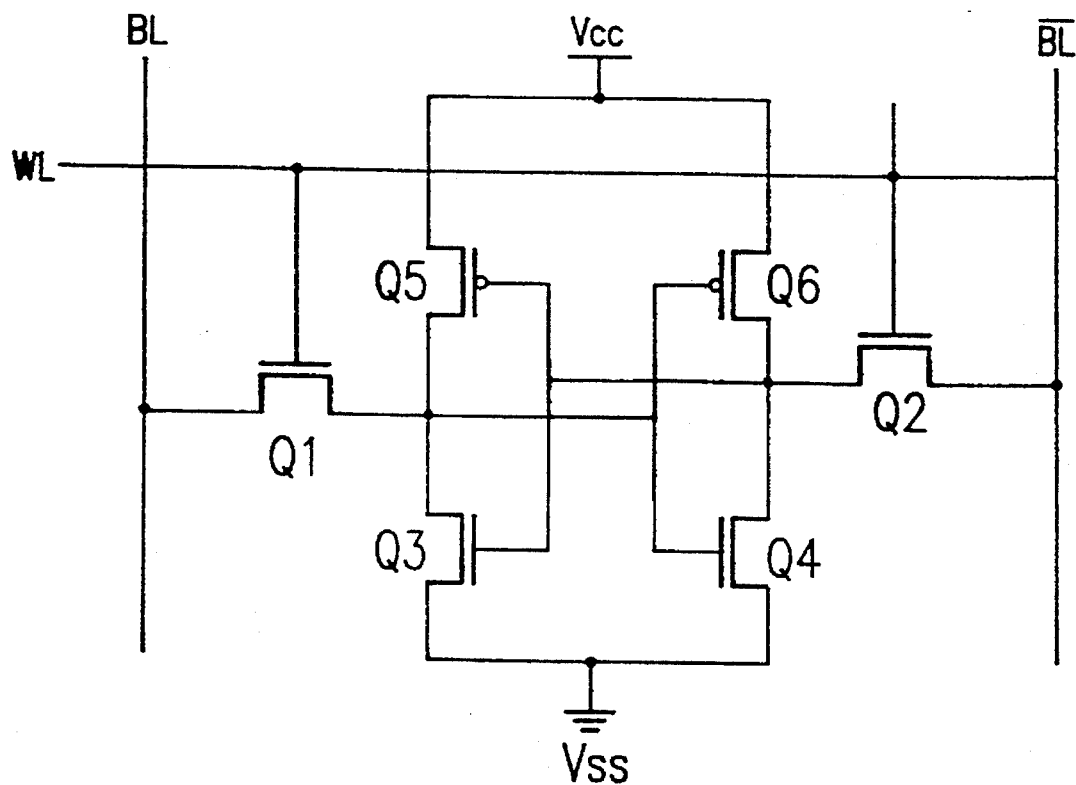
FIG. 1 is an equivalent circuit of a conventional SRAM cell.
Figure 2A:
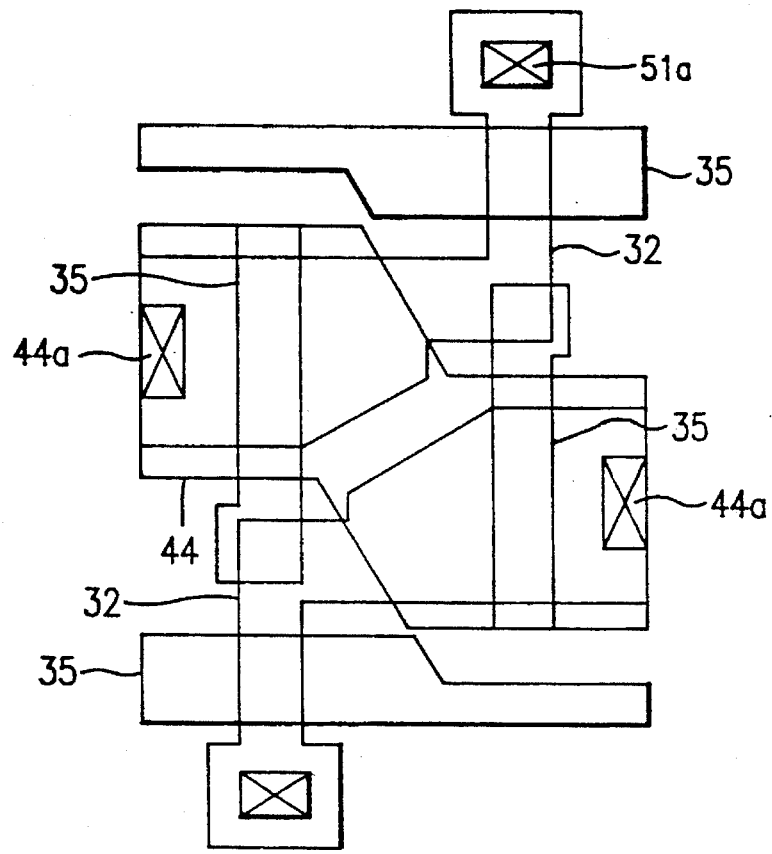
FIG. 2a is a layout of bulk transistors of an SRAM cell in accordance with the conventional art.
Figure 2B:
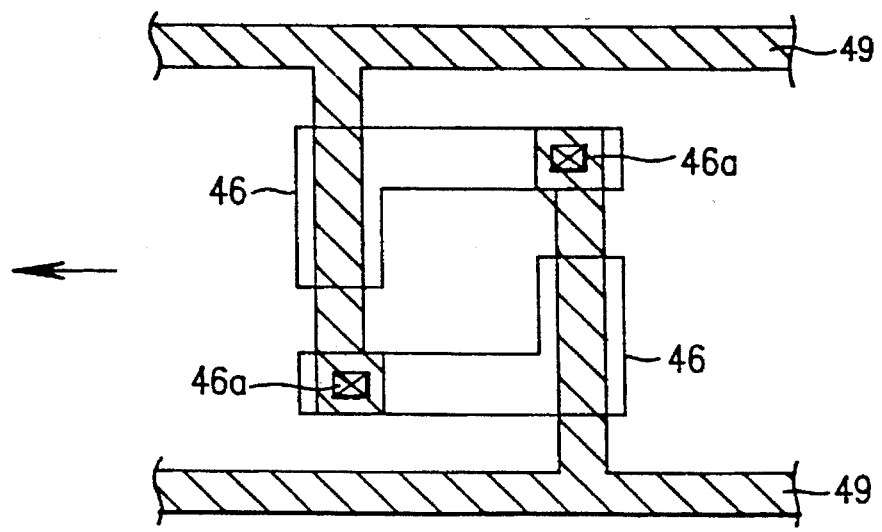
FIG. 2b is a layout of TFTs of an SRAM cell in accordance with the conventional art.
Figure 3:
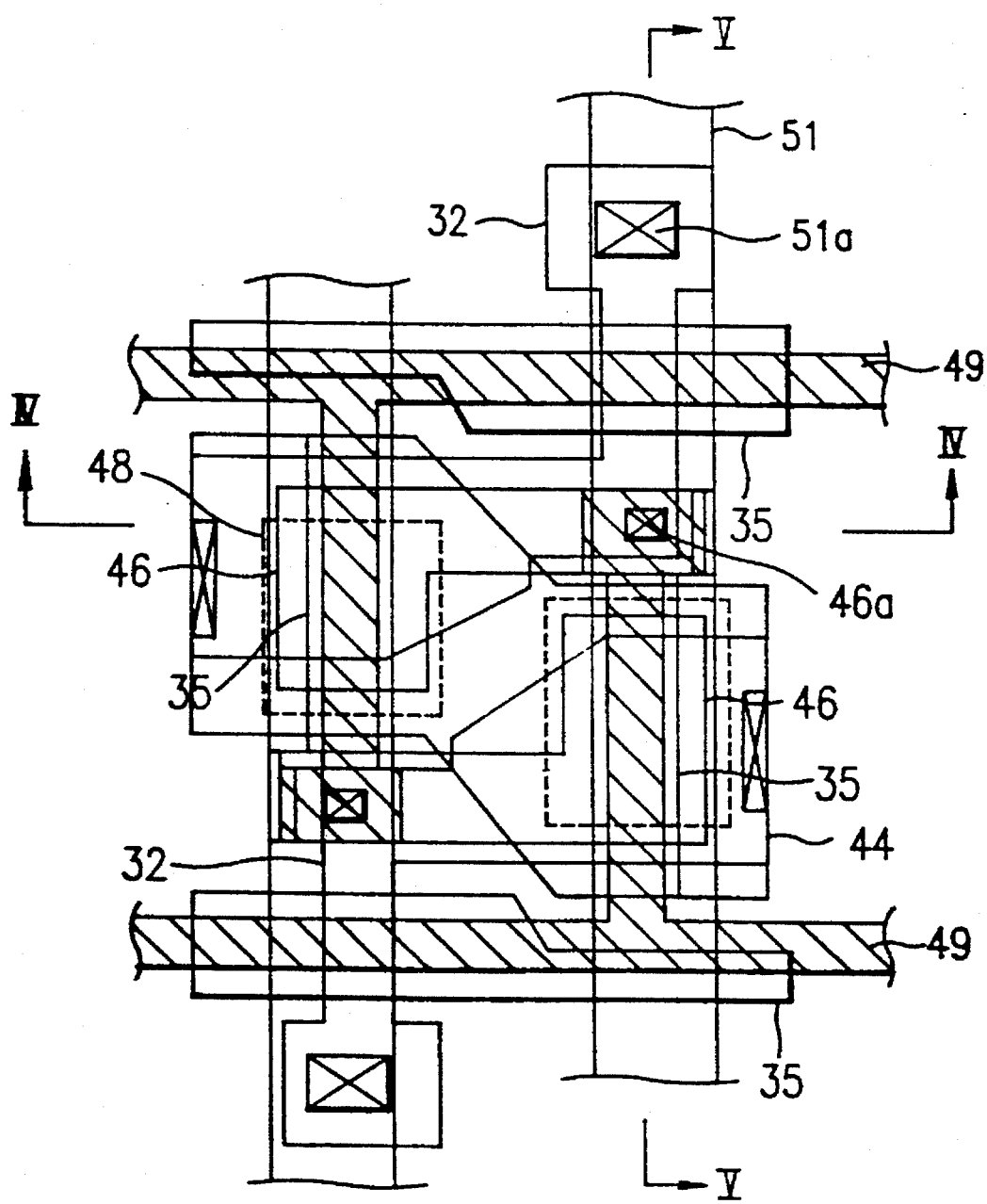
Figure 4:
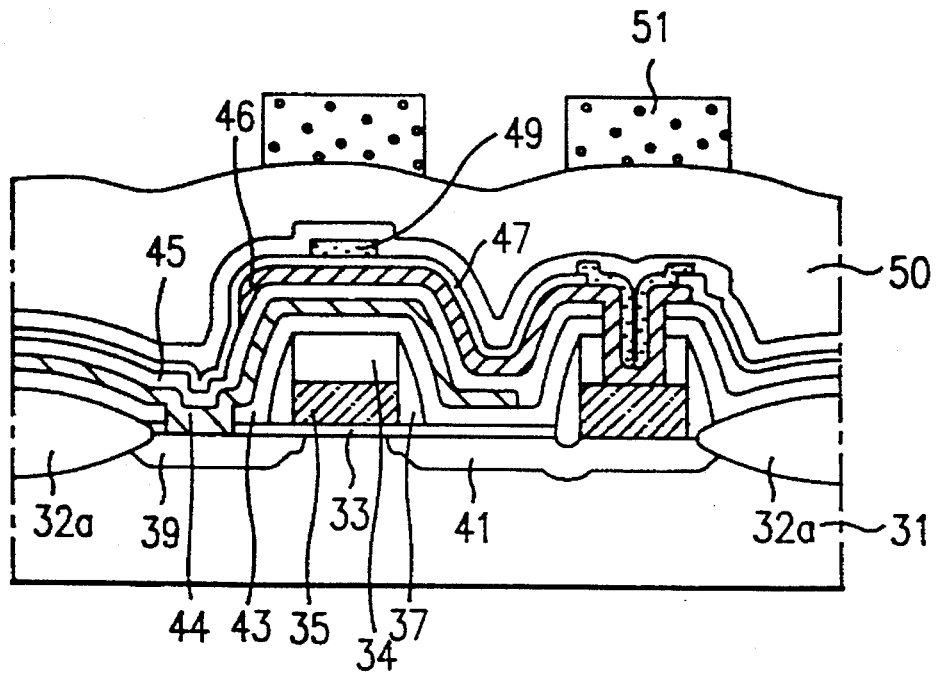
FIG. 4 is a cross-sectional view of the SRAM cell shown in FIG. 3, taken along the line IV—IV of FIG. 3.
Figure 5:
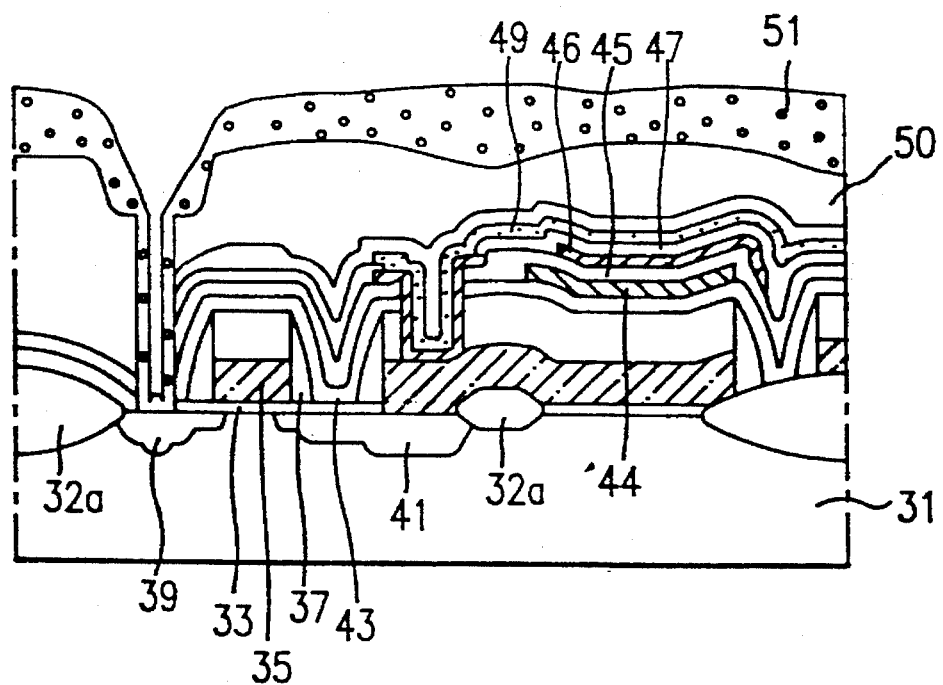
FIG. 5 is a cross-sectional view of the SRAM cell of FIG. 3, taken along the line V—V of FIG. 3.
Figure 6:
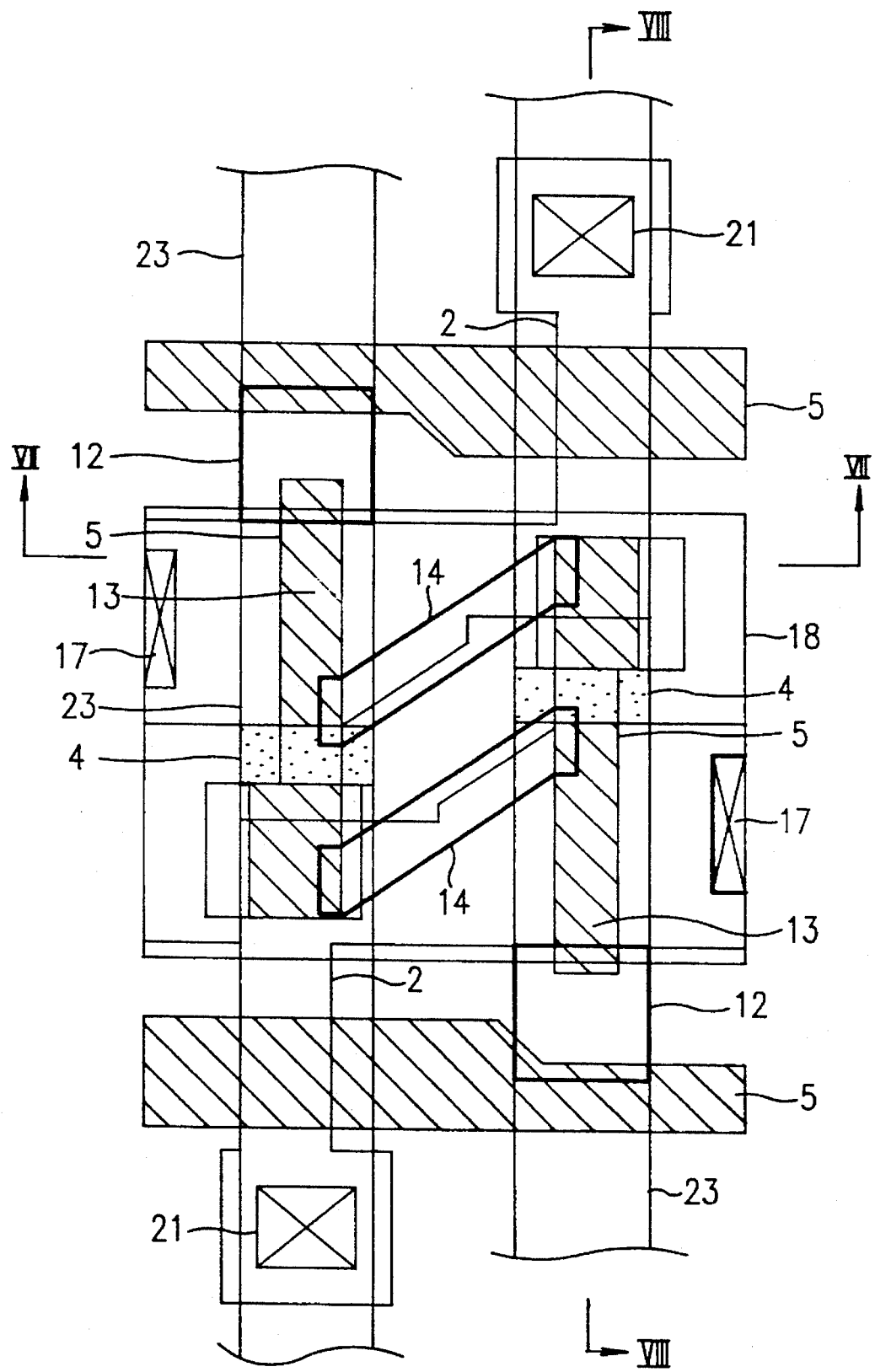
FIG. 6 is an exemplary layout of an SRAM cell in accordance with an embodiment of the present invention.
Figure 7:
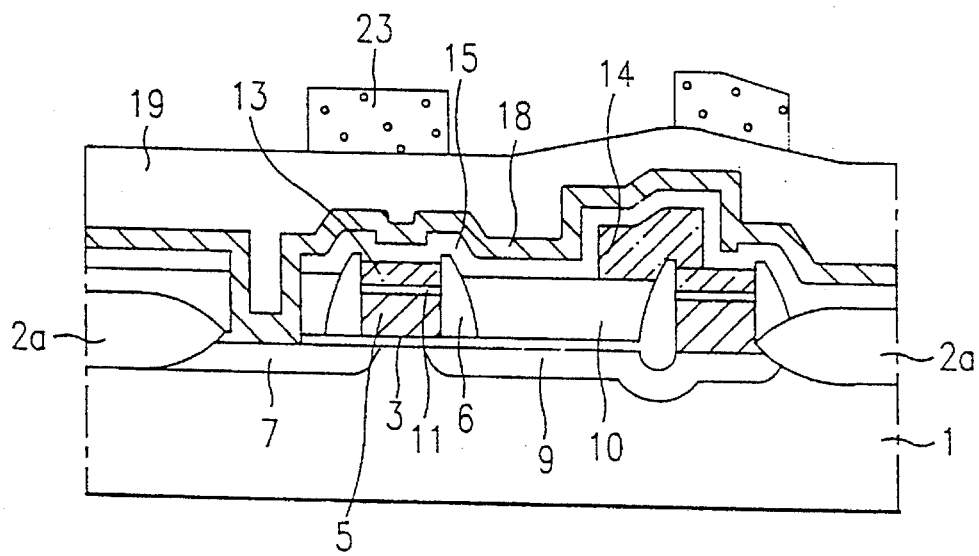
FIG. 7 is a cross-sectional view of the SRAM cell shown in FIG. 6, taken along the line VII—VII of FIG. 6.
Figure 8:
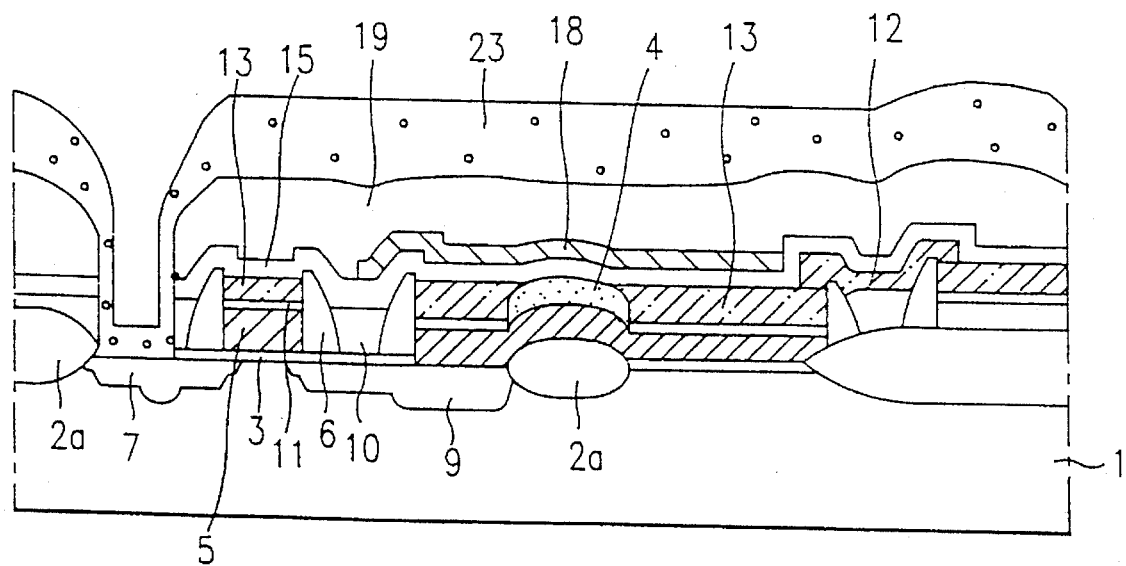
FIG. 8 is a cross-sectional view of the SRAM cell shown in FIG. 6, taken along the line VIII—VIII of FIG. 6.

Referring to FIGS. 6–8, an SRAM cell of the present invention comprises two first bulk transistors and two second bulk transistors formed on a semiconductor substrate 1, and two TFTs formed over the two second bulk transistors.

The first and second bulk transistors each comprise a first gate oxide 3 formed on active regions 2 defined on the substrate 1, a common gate electrode 5 formed on the first gate oxide 3, and first and second impurity-doped regions 7 and 9 formed on the surface of the substrate 1 as source and drain regions.

A sidewall oxide layer 6 is formed on the sides of the common gate electrode 5. A first BPSG layer 10 is formed in a valley between the sidewall oxide layer 6. The two TFTs each employ the common gate electrode of the second bulk transistor as their gate electrode, and are composed of a second gate oxide layer 11 formed on the common gate electrode 5 and a conductive layer 13 formed on the second gate oxide layer 11. The conductive layer 13 is used as source, drain and channel regions and connected to a Vss pad 12 which overlaps the first and second bulk transistors by a predetermined width. The conductive layer 13 is also connected to a transistor connector 14 superposed on the second bulk transistors by a predetermined width.

An interlevel insulating layer 15 is formed on the conductive layer 13. A Vss line 18 is formed on the interlevel insulating layer 15 and connected to the first impurity-doped region of the second bulk transistors. A second BPSG layer 19 is formed on the Vss line 18.

A bitline 23 is formed on the second BPSG layer 19 and connected to the first impurity-doped region of the first bulk transistors. A method of fabricating the SRAM cell of the present invention will be explained below with reference to the accompanying drawings.

Figure 9A:
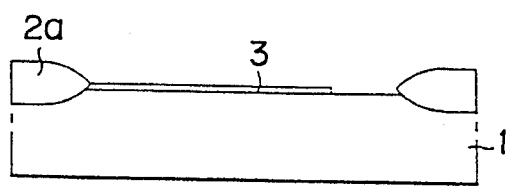
FIGS. 9a–9g are cross-sectional views of the SRAM cell, taken along the line VII—VII of FIG. 6, showing the sequence of a manufacturing process according to an embodiment of the present invention.
Figure 10A:
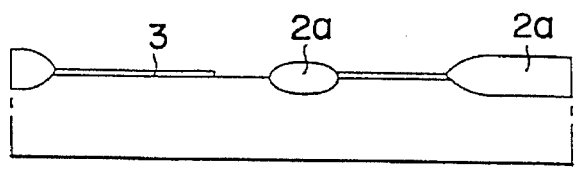
FIGS. 10a–10g are cross-sectional views of the SRAM cell, taken along the line VIII—VIII of FIG. 6, showing the sequence of the manufacturing process.

First, as shown in FIGS. 9a and 10a, a semiconductor substrate 1 is prepared, and active regions 2 and field regions 2a are defined on the surface of the substrate 1 by LOCOS process. A first gate oxide 3 is then formed on the active regions 2 and is selectively etched to form a contact.

Figure 9B:
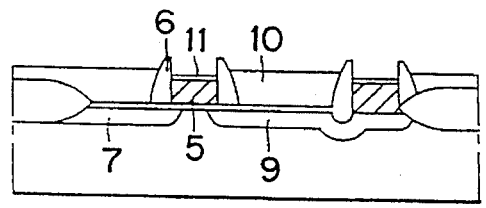
Figure 10B:
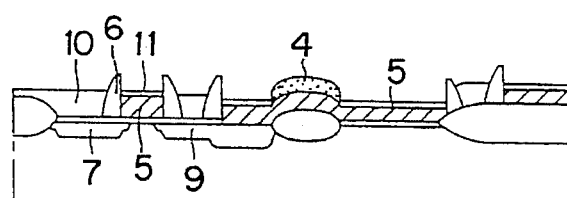

Next, as shown in FIGS. 9b and 10b, polysilicon is deposited on the first gate oxide 3 to a predetermined thickness, and cap gate nitride layer 4 is deposited thereon. The stack of the cap gate nitride and polysilicon layers is patterned and etched, to form a common gate electrode 5.

Subsequently, oxide is deposited on the overall surface of the substrate, and etched by anisotropic etching process, to form a sidewall oxide layer 6 on the sides of the common gate electrode 5. Then, first and second impurity-doped regions 7 and 9, as source and drain regions, are formed by ion-doping n+ impurity ions into the active regions 2, to complete the formation of the first and second bulk transistors on the substrate 1.

A first BPSG layer 10 is formed by depositing materials such as BPSG and PSG onto the valley formed between the sidewall oxide layers 6, to thereby planarize the surface of the substrate.

Figure 9C:
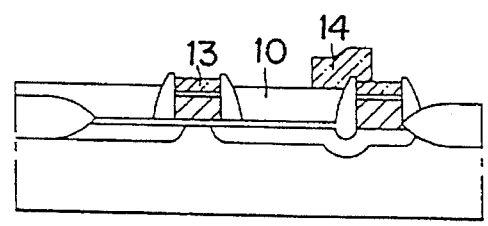
Figure 10C:
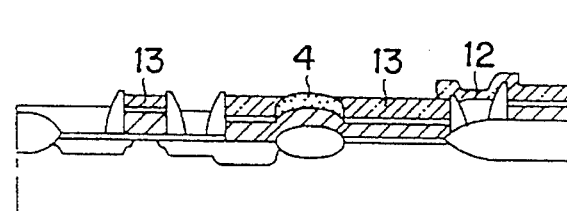

As shown in FIGS. 9c and 10c, the first BPSG layer 10 is etched back in order to expose a cap nitride layer 4 formed on the common gate electrode 5. Using a wet etch process, portions of the cap nitride layer 4 are selectively removed and the remaining cap nitride layer 4, left on a predetermined portion of the common gate electrode of the respective second bulk transistors, makes contact with the end of a PMOS transistor.

Then, a second gate oxide layer 11 of the TFTs is formed by oxidizing the exposed surface of the first and second bulk transistors. Polysilicon is deposited on the overall surface of the substrate to a predetermined thickness.

A conductive layer 13 as channel, source and drain regions is formed by etching back the polysilicon layer. The conductive layer 13 is formed only on the first and second bulk transistor, a Vss pad 12 and a transistor connector 14. The Vss pad 12 is formed to contact the conductive layer 13, while the mask pattern of the Vss pad 12 overlaps the first and second bulk transistors by a predetermined width. The transistor connector 14 is formed to contact the conductive layer 13, while the mask pattern of the transistor connector 14 overlaps the second bulk transistors by a predetermined width.

Figure 9D:
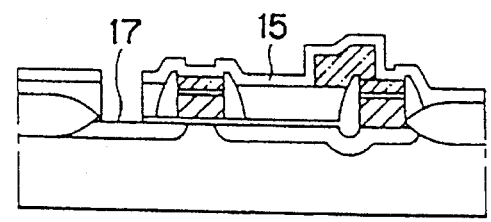
Figure 10D:
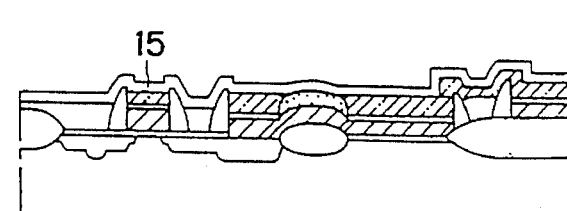

As shown in FIGS. 9d and 10d, an interlevel insulating layer 15 is deposited on the overall surface of the substrate, and selectively etched to expose the first impurity-doped region 7 of the second bulk transistors. As a result, a first contact hole 17 is formed.

Figure 9E:
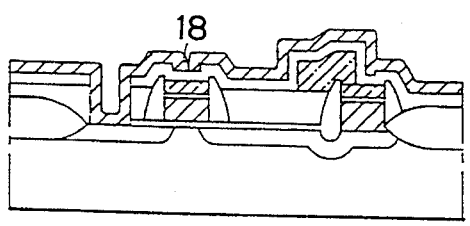
Figure 10E:
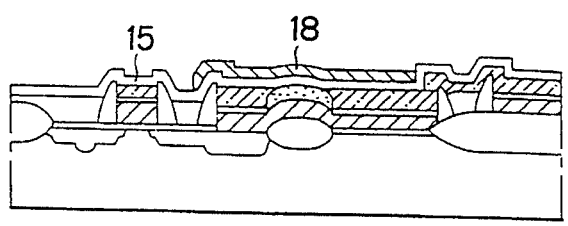

Then, as shown in FIGS. 9e and 10e, polysilicon is deposited on the interlevel insulating layer 15, making contact with the first impurity-doped region 7 through the first contact hole 17. The formed polysilicon layer is etched back to create a Vss line 18.

Figure 9F:
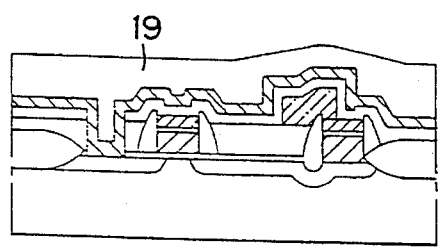
Figure 10F:
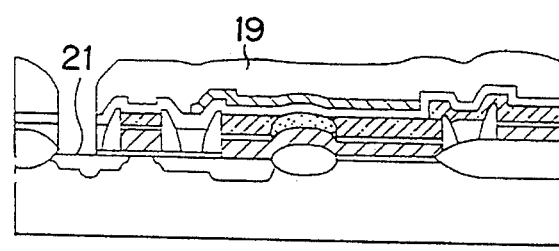

As shown in FIGS. 9f and 10f, a second BPSG layer 19 is formed by depositing BPSG on the overall surface of the substrate. The BPSG layer is etched back to expose the first impurity-doped region 7 of the first bulk transistors and to form a second contact hole 21 for metal contact.

Figure 9G:
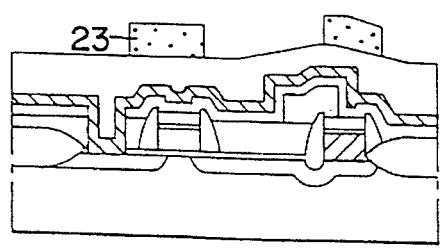
Figure 10G:
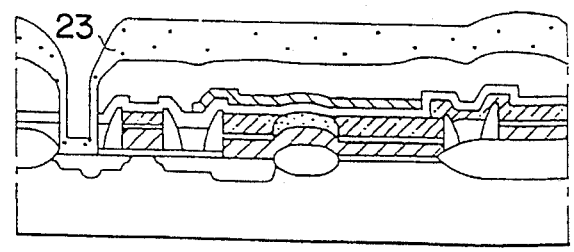

Subsequently, as shown in FIGS. 9g and 10g, bitline 23 is formed by depositing a metal material (for example, Al) on the second BPSG layer 19. The bitline 23 contacts the first impurity-doped region 7 through the second contact hole 21, to thereby complete the manufacturing process of the SRAM cell according to the embodiment of the present invention.

In the memory cell formed by the aforementioned processes of the present invention, a common gate electrode is used as the gate electrodes of the TFTs and bulk transistors. The step of forming the gate electrode of the TFTs is eliminated, which decreases the number of processing steps involved in manufacturing the memory cell.

According to the present invention, alignment of offset is determined according to the arrangement of the common gate electrode of the bulk transistor. By doing so, the alignment of offset can be performed easily and more accurately.

Accordingly, characteristics of the TFTs become uniform, which results in more stable characteristics of the SRAM. Furthermore, the step coverage of the cell is enhanced because a common gate electrode is used in the second bulk transistors and in the TFTs. As a result, the metallization process is facilitated.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of fabricating an SRAM cell, comprising the steps of:

forming a plurality of active regions and field regions on a substrate;

forming a first common gate electrode and two first impurity-doped regions on said active regions to thereby form two first bulk transistors;

forming a second common gate electrode and two second impurity-doped regions on said active regions separated from said first bulk transistors by a predetermined distance, to thereby form two second bulk transistors;

forming a gate oxide layer on the overall surface of the substrate;

depositing a conductive layer to form a thin film transistor body on said gate oxide layer; and etching back said conductive layer so that said conductive layer remains only on said first and second common gate electrodes, Vss connectors overlapping said common gate electrodes by a predetermined width, and transistor connectors overlapping said second common gate electrode by a predetermined width, thereby forming two thin film transistors.

2. A method of fabricating an SRAM cell as claimed in claim 1, wherein said step of forming said common gate electrodes comprises the steps of:

depositing a polysilicon layer on said active regions; and depositing a cap nitride layer on said polysilicon layer and etching a predetermined portion of said cap nitride layer through photolithography.

3. A method of fabricating an SRAM cell as claimed in claim 1, wherein said step of forming said impurity-doped regions comprises the steps of:

forming a sidewall oxide layer on the sides of said common gate electrodes; and forming said first and second impurity-doped regions on said active regions by implanting impurity ions into said active regions.

4. A method of fabricating an SRAM cell as claimed in claim 2, wherein said step of etching said cap nitride layer comprises the steps of:

forming a BPSG layer in a valley formed between said common electrodes;

etching back said BPSG layer so that said cap nitride layer formed on said common gate electrode is exposed; and etching said cap nitride layer so that said cap nitride layer remains only on said common gate electrodes of said second bulk transistors.

5. A method of fabricating an SRAM cell as claimed in claim 4, wherein said cap nitride layer is etched by a wet etch process.

6. A method of fabricating an SRAM cell as claimed in claim 1, further comprising the steps of:

forming a conductive layer on the overall surface of the substrate;

forming a mask pattern on said conductive layer so that the tops of said first and second bulk transistors overlap each other by a predetermined width; and etching back said conductive layer so that said conductive layer remains on only said first and second bulk transistors including said mask pattern, whereby said Vss connector is formed.

7. A method of fabricating an SRAM cell as claimed in claim 1, further comprising the steps of:

forming a conductive layer on the overall surface of the substrate;

forming a mask pattern on said conductive layer so that the tops of said second bulk transistors overlap each other by a predetermined width; and etching back said conductive layer to remain only on said first and second bulk transistors including said mask pattern, whereby said transistor connector is formed.

8. A method of fabricating an SRAM cell as claimed in claim 7, further comprising the step of disposing one end of said mask pattern which contacts said cap nitride layer.

* * * * *

UNITED STATES PATENT AND TRADEMARK OFFICE
CERTIFICATE OF CORRECTION

PATENT NO. : 5,599,729
DATED : February 4, 1997
INVENTOR(S) : Joon-Young Park

It is certified that error appears in the above-indentified patent and that said Letters Patent is hereby corrected as shown below:

Column 2, line 67, change "Vss connectors" to --Vcc connectors--.

Column 4, line 9, change "Vss pad" to --Vcc pad--.

Column 4, line 62, change "Vss pad" to --Vcc pad--.

Column 4, line 63, change "Vss pad" to --Vcc pad--.

Column 4, line 64, change "Vss pad" to --Vcc pad--.

Column 6, line 3, change "Vss connectors" to --Vcc connectors--.

Signed and Sealed this

Fourteenth Day of July, 1998

Attest:

BRUCE LEHMAN

*Attesting Officer*   *Commissioner of Patents and Trademarks*